United States Patent [19]

Matsuura

[11] Patent Number: 4,618,837

[45] Date of Patent: Oct. 21, 1986

[54] LOW-POWER CONSUMPTION REFERENCE PULSE GENERATOR

[75] Inventor: Yoshiaki Matsuura, Tokyo, Japan

[73] Assignee: Kabushiki Kaisha Daini Seikosha, Tokyo, Japan

[21] Appl. No.: 393,307

[22] Filed: Jun. 29, 1982

[30] Foreign Application Priority Data

Jul. 3, 1981 [JP] Japan ................................. 56-104846

[51] Int. Cl.$^4$ .............................................. H03B 5/32
[52] U.S. Cl. ................................... 331/160; 331/186; 331/116 FE; 368/159
[58] Field of Search ............. 331/116 FE, 116 R, 158, 331/160, 185, 186; 368/156, 157, 159, 167

[56] References Cited

U.S. PATENT DOCUMENTS 3,999,368 12/1976 Yoshida .............................. 368/159
4,128,816 12/1978 Shimotsuma .................... 331/186 X
4,433,371 2/1984 Leuthold ................... 331/116 FE X

FOREIGN PATENT DOCUMENTS 0038249 4/1978 Japan ................................... 331/160

Primary Examiner—Eugene R. LaRoche
Assistant Examiner—Robert J. Pascal
Attorney, Agent, or Firm—Robert E. Burns; Emmanuel J. Lobato; Bruce L. Adams

[57] ABSTRACT

A reference pulse generator comprises a quartz crystal oscillator, a frequency divider connected to the oscillator for frequency dividing the oscillator output, and a constant current generator connected in series both with the oscillator and the frequency divider to control the current applied to the oscillator from a power source. The constant current generator comprises a current limiting element, such as a MOSFET, which is controlled by a reference voltage produced by a reference voltage generator.

15 Claims, 5 Drawing Figures

LOW-POWER CONSUMPTION REFERENCE PULSE GENERATOR

BACKGROUND OF THE INVENTION

The present invention relates to a reference pulse generator for attaining low-power consumption.

In electronic timepieces, a pulse generator using a quartz resonator as a reference signal source has been used to minimize power consumption in a quartz oscillator and a divider which divides the outputs from the oscillator. To reduce power consumption of the oscillator, first, the examination has been made of the various circuit systems of the oscillator. However, all the above examination has been made on the circuit systems and the design constant for reducing the straight-through current which flows irrespective of oscillation. In the divider, the micronization of MOS structure and the examination on the circuit systems such as dynamic division has been made up to the present. The above conventional systems have been examined on the assumption that the employed battery voltage is used in the reference pulse generator as it is, taking an electronic timepiece for example. To reduce the power consumption, the drive voltage is reduced to satisfy the relation shown by the formula (1).

$$I = fCV \tag{1}$$

where I denotes the power consumption, f the operating frequency, C the load capacitance and V the drive voltage.

Conventionally, a voltage V′, which is lower than the drive voltage V, is used for an oscillating portion and a dividing portion of the reference pulse generator to reduce the drive voltage V.

FIG. 1 shows a conventional circuit structure comprising a power source 1, a reference voltage generator 2 connected with terminals 6 and 7 of the power source 1, a quartz oscillator 3 for producing an oscillatory output signal and being connected with a voltage generating terminal 9 of the reference voltage circuit 2 and a terminal 6 of a power source 1, a divider 4, the discriminator 5 for discriminating the start of oscillation of the oscillator in response to an output 11 from the divider 4.

FIG. 2 shows an example of a quartz oscillator, in which the following relation is generally held between the voltage $V^{start}$ necessary for starting oscillation and the voltage $V^{stop}$ necessary for maintaining the oscillation.

$$V^{start} \geq V^{stop} \tag{2}$$

Thus, in the conventional method of reducing the power consumption by means of controlling the voltage, a voltage $V_{D2}$ higher than $V^{start}$ and a voltage $V_{D1}$ between $V^{start}$ and $V^{stop}$ are produced to drive the reference pulse generator at an optimum voltage for a long time. $V_{D2}$ is applied to start the oscillation of the oscillator, and then $V_{D1}$ is applied when the oscillator stabilizes in a normal oscillation state to drive the reference pulse generator. To change the voltage from $V_{D1}$ to $V_{D2}$ and vice versa, the discriminator 5, which discriminates whether the oscillator normally oscillates or stops, is needed. Since the oscillator changes going through several stages from the stop state to the normal oscillating state, and since the intermediate stages of the operating condition cannot be easily discriminated from an operating condition produced by an external noise, it is extremely difficult to drive the discriminator 5 precisely. For example, when the discriminator discriminates that the output 11 from the divider 4 produced by noise is normal, the output from the discriminator 5 controls the reference voltage generator 2 and changes the voltage $V_{D2}$, which is necessary for oscillation to the voltage $V_{D1}$, which does not start the oscillation but is sufficient to maintain the oscillation. As a result, the voltage is reduced although the oscillator does not oscillate normally, and it is impossible to then start oscillation. Thus, a precise discrimination of the discriminator is an absolute condition in case the closed loop is controlled, however, this method is extremely dangerous when applied to the reference pulse generator because the probability of mis-discrimination by the discriminator is high.

BRIEF SUMMARY OF INVENTION

Accordingly, it is an object of the present invention to provide a reference pulse generator for attaining low-power consumption.

It is another object of the invention to provide a voltage system which does not use a discriminator.

These and other objects, features and advantages of the invention will become more apparent upon a reading of the following detailed specification and drawing.

DETAILED DESCRIPTION OF THE PREFERRED EMBODIMENTS

Figure 2:
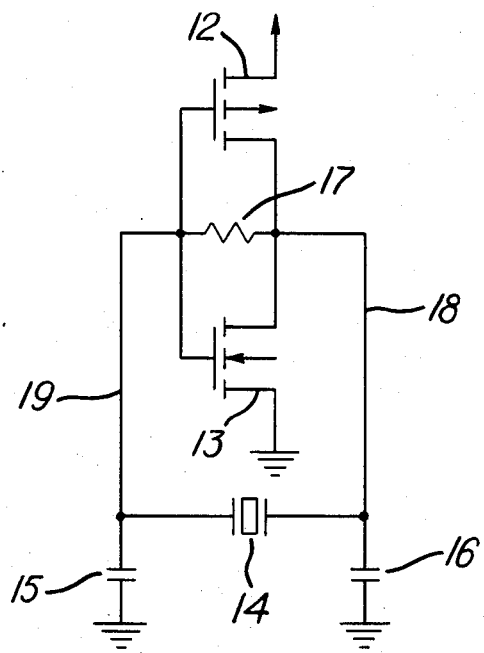
FIG. 2 is a circuit diagram showing an embodiment of the quartz oscillators 3 and 22.
Figure 3:
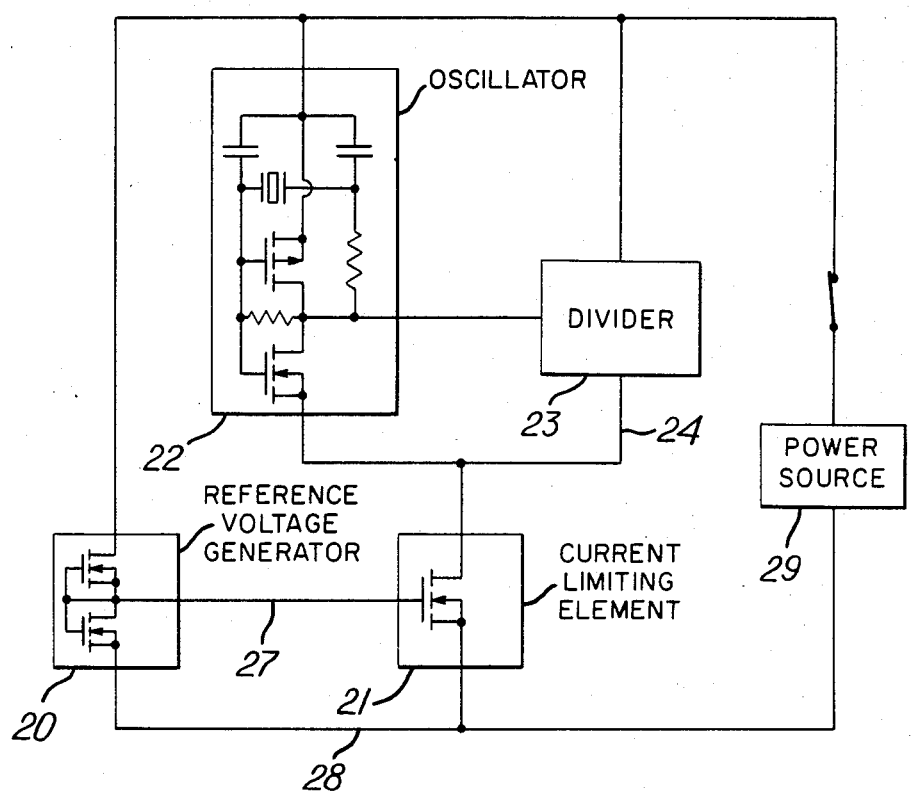
FIG. 3 shows the structure of a reference pulse generator according to the present invention.
Figure 4:
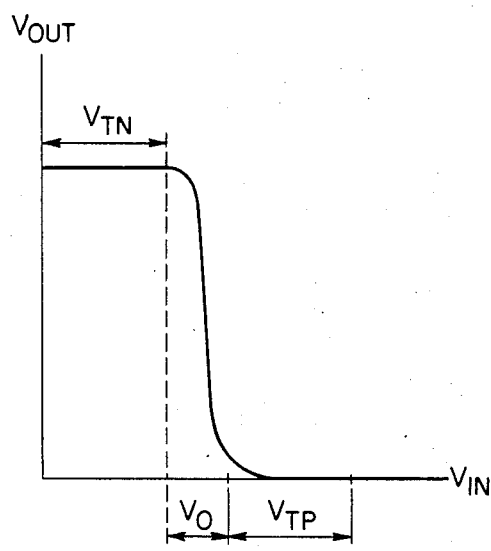
FIG. 4 shows the relation between input and output signals of the quartz oscillator of the system in FIG. 2.

FIG. 3 shows one embodiment of the present invention. A reference voltage generator 20 is connected across a power source 29, and current from a current restrictng or current limiting element 21 is restricted by an output signal 27 from the reference voltage generator 20. The current restricting element 21 has one terminal connected to a terminal 28 of the power source 29, and another terminal connected to a connecting point 24 of terminals of a divider 23 and an oscillator 22. The other terminals of the oscillator 22 and the divider 23 are connected to the other terminal 26 of the power source 29. The current restricting element 21 is composed of a MOSFET and the like. The operation of FIG. 3 will be described assuming that the oscillator 22 is composed of a complementary MOS inverter in which a P channel MOS transistor 12 is connected in series with an N channel MOS transistor 13 as shown in FIG. 2. The voltage $V_{D2}$ is the sum of the threshold voltage $V_{TP}$ of the P channel MOS transistor, the threshold voltage $V_{TN}$ of the N channel MOS transistor (shown in FIG. 4) and the voltage $V_0$ which closes both the P channel MOS transistor 12 and the N channel MOS transistor 13. It is necessary to apply the voltage $V_{D2}$ between the power source line 26 and the connecting point 24 in FIG. 3 to start oscillation.

The voltage $V_{D2}$ at the start of oscillation will be given by the formula (3).

$$V_{D2} \geq |V_{TP}| + V_{TN} + V_0 \qquad (3)$$

After the start of oscillation, the relation given by the formula (3) changes to the relation given by the formula (4). When the voltage needed to maintain the oscillation is $V_{D1}$, $$V_{D2} \geq V_{D1} \geq |V_{TP}| + V_{TN} \qquad (4)$$

Figure 5:
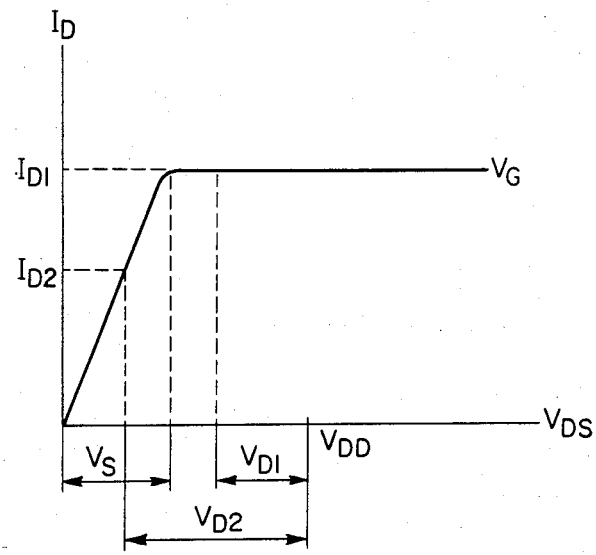
FIG. 5 shows the relation between the source-drain voltage $V_{DS}$ and the drain current $I_D$ of the current restricting element 21.

FIG. 5 shows the relation between the source-drain voltage $V_{DS}$ of the MOSFET 21 and the drain current $I_D$ in the case where the current restricting element 21 in FIG. 3 is composed of a MOSFET. Namely, FIG. 5 shows the relation between the source-drain voltage $V_{DS}$ and the drain current $I_D$ when the voltage of the output signal 27 from the reference voltage generator 20 in FIG. 3 is $V_G$. A fixed value current $I_{D1}$ flows if the voltage difference between the voltage $V_{D1}$, applied to the terminal 26 of the power source 29 and the connecting point 24, and the source voltage $V_{DD}$, applied to both the terminals 26 and 28 of the power source in FIG. 3, is higher than the saturation source-drain voltage $V_S$ of the MOSFET, while the current $I_{D2}$, which reduces with the reduction in the source-drain voltage $V_S$, flows if the former voltage is lower than the latter.

If $V_{DD} - V_D \geq V_S$, $I_D = I_{D1}$ fixed value
If $V_{DD} - V_D \leq V_S$, $I_D = I_{D2}$ variable value Since the frequency divider does not operate at the start of oscillation in FIG. 3, the current consumption $I_{DIV}'$ at that instant is extremely small. Therefore, the oscillator can use almost the maximum value $I_{D1}$ of the current through the current restricting element. If the current of the oscillator at the start of oscillation is $I_{OSC}'$, the relation $I_{D1} \approx I_{OSC}'$ is established. In this case the voltage necessary for starting oscillation is larger than the balance between the source voltage $V_{DD}$ shown in FIG. 5 and the saturation source-drain voltage $V_S$ of the MOS current restricting element, the voltage $V_D$ applied to the power source terminal 26 and the connecting point 24 in FIG. 3 comes to be automatically higher and becomes the voltage $V_{D2}$ necessary for starting the oscillation. This time the current through the current restricting element 21 becomes smaller with an increase in $V_D$.

To start the oscillation, in the first place, the applied voltage should satisfy the formula (3) when the circuit in FIG. 2 is used. Secondary, the current necessary for starting the oscillation should satisfy the formula (4). The voltage $V_D$ applied to the oscillator 22 and the divider 23 increases according to the power product formula (6) which satisfies the formulae (3) and (4), and the current $I_D$ through the current restricting element reduces. When the power product necessary for starting the oscillation is K, the bias automatically varies until $$V_D \cdot I_D \geq K \qquad (6)$$

is satisfied.

If the voltage for starting the oscillation is less than the balance between the source voltage $V_{DD}$ and the source-drain voltage $V_S$ of the current restricting element, the saturation current $I_{D1}$ of the current restricting element is divided into the oscillation start current $I_{OSC}'$ and the current $I_{DIV}'$ through the divider and the formula (7) is held.

$$I_{D1} = I_{OSC}' + I_{DIV}' \qquad (7)$$

As seen from the formula (7), after the normal oscillation is started, the current $I_{DIV}'$ necessary for division increases and the oscillator current $I_{OSC}$ decreases, and each of the currents become the oscillator current $I_{OSC}$ for maintaining the oscillation and the current $I_{DIV}$ through the divider in the normal oscillation. Since the sum of the currents does not change, the relations given by the formulae (8), (9) and (10) are held as follows.

$$I_{DIV} > I_{DIV}' \qquad (8)$$

$$I_{OSC} < I_{OSC}' \qquad (9)$$

$$I_{D1} = I_{OSC} + I_{DIV} = I_{OSC}' + I_{DIV}' \qquad (10)$$

Since the current applied from the current restricting element 21 is shared among the divider 23 and the oscillator 22, the above operation positively utilizes the difference in necessary current ratios at the start of oscillation and at the stable oscillation between the divider and the oscillator. In this manner, the current restricting element 21 functions as a constant current generator for controlling the current flow through the oscillator 22 and the frequency divider 23. Further, the voltages applied to the oscillator and the divider can be automatically varied and the oscillator and the divider can be driven with the optimum voltages because this is not a voltage control system, thereby, a circuit for discriminating whether or not the oscillator starts oscillation is unnecessary and the circuit opens. Accordingly, the stable operation is maintained once the stable operating condition is settled. While the present embodiment has been illustrated with respect to the oscillator of the complementary MOS inverter system shown in FIG. 2, it is to be noted that the system is not restricted thereto. This system is based on the principle that the energy necessary for starting an oscillation is always larger than the energy for maintaining the oscillation. The above principle can be applied to other systems as well.

Figure 1:
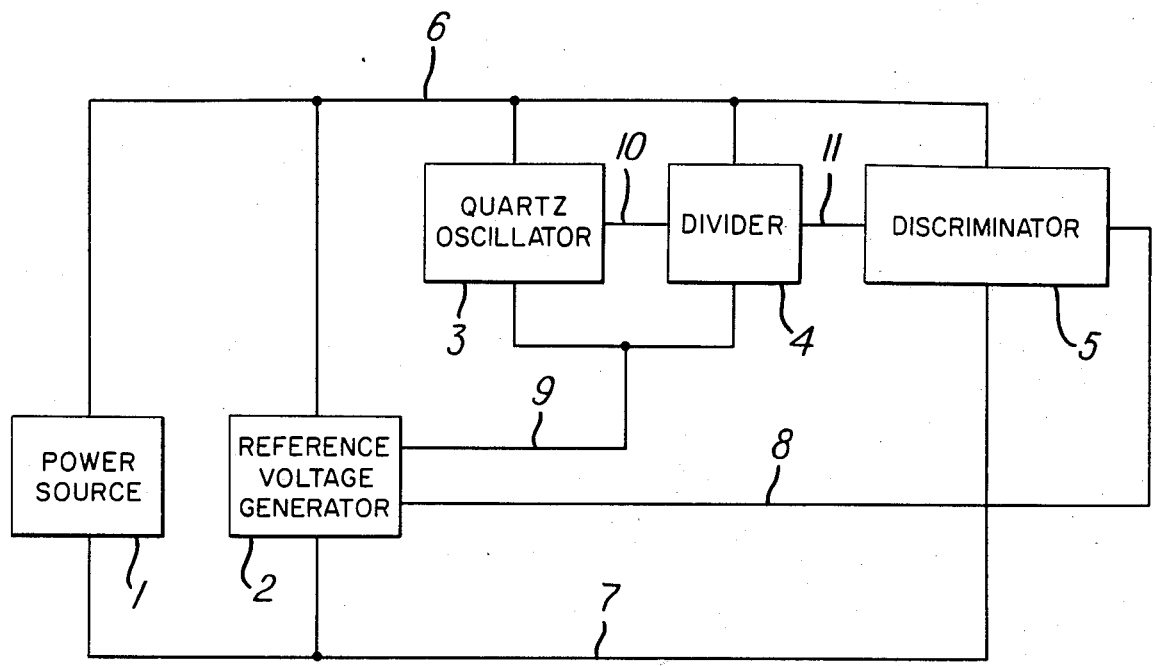
FIG. 1 shows the structure of a reference pulse generator of a conventional voltage control system.

The present invention achieves a remarkable reduction in the power consumption, which cannot be achieved by the conventional system which applies the source voltage as it is, by applying the invention to the low-power consumption reference pulse generator in an electronic timepiece or the like. Conventionally a power consumption of 0.3 μA was the minimum value attainable by a system using a 32 KHz quartz resonator, a 1.57 V silver oxide battery and a 1.5 V source voltage, while a power consumption of 0.15 μA has been realized by adopting the present system. In the present system, the output from the reference pulse generator is the same as that in the conventional system which applies the source voltage as it is, and it has no disadvantages caused by reduction in the power consumption. In the voltage control system illustrated in FIG. 1, on the other hand, the circuit structure is complicated and mis-detection by the discrimination easily occurs in the conventional system in which the source voltage is applied as it is when the reference pulse generator is tested or driven. The present invention realizes a remarkable reduction in current consumption without adversely affecting features such as electrical characteristics, operability, and rate of acceptance in the manufacturing process. The present inventin will largely contribute to the prolongation of the power source in electronic devices in the future.

What I claim is:

1. A reference pulse generator for use with a power source comprising: a quartz crystal oscillator for producing an oscillatory output; a frequency divider connected to receive the oscillatory output of the oscillator; a reference voltage generator for producing a reference voltage; and a constant current generator connected in series both with the oscillator and the frequency divider to control the current applied to the oscillator and the frequency divider from a power source, the constant current generator being connected to receive the reference voltage produced by the reference voltage generator.

2. A reference pulse generator as claimed in claim 1; in which the constant current generator comprises a MOSFET.

3. A reference pulse generator powered during use by a power source comprising: an oscillator for producing an oscillatory output signal; a frequency divider connected to the oscillator for receiving and frequency dividing the oscillatory output signal; a reference voltage generator for producing a reference voltage; and constant current generating means connected in series with the oscillator and in series with the frequency divider and responsive to the reference voltage the controlling the current flow through the oscillator and the frequency divider.

4. A reference pulse generator acording to claim 3; wherein the constant current generating means comprises a current limiting element.

5. A reference pulse generator according to claim 4; wherein the current limiting element comprises a MOSFET having a gate connected to receive the reference voltage and a source-drain path connected in series both with the oscillator and the frequency divider.

6. A reference pulse generator according to claim 3; wherein the oscillator and the frequency divider each have one terminal connectable to a power source during use of the reference pulse generator and each have another terminal connected to the constant current generating means.

7. A reference pulse generator according to claim 3; wherein the oscillator and the frequency divider each have one terminal connectable to one terminal of a power source during use of the reference pulse generator and each have another terminal; and wherein the constant current generating means comprises a current limiting element having a first terminal connected to receive the reference voltage produced by the reference voltage generator, a second terminal connected to said another terminal of the oscillator and the frequency divider, and a third terminal connectable to the other terminal of the power source.

8. A reference pulse generator according to claim 7; wherein the current limiting element comprises a MOSFET having a gate comprising the first terminal, and a source-drain path connected to said another terminal of the oscillator and the frequency divider and connectable to said other terminal of the power source.

9. A reference pulse generator powered during use by a power source comprising: an oscillator for producing an oscillatory output signal; a frequency divider connected to the oscillator for receiving and frequency dividing the oscillatory output signal; a reference voltage generator for producing a reference voltage; and constant current generating means responsive to the reference voltage for producing a constant current and connected in series both with the oscillator and the frequency divider so that part of the constant current flows through the oscillator and the remaining part flows through the frequency divider.

10. A reference pulse generator according to claim 9; wherein the constant current generating means comprises a current limiting element.

11. A reference pulse generator according to claim 10; wherein the current limiting element comprises a MOSFET having a gate connected to receive the reference voltage and a source-drain path connected in series both with the oscillator and the frequency divider.

12. A reference pulse generator according to claim 9; wherein the oscillator and the frequency divider each have one terminal connectable to a power source during use of the reference pulse generator and each have another terminal connected to the constant current generating means.

13. A reference pulse generator according to claim 9; wherein the oscillator and the frequency divider each have one terminal connectable to one terminal of a power source during use of the reference pulse generator and each have another terminal; and wherein the constant current generating means comprises a current limiting element having a first terminal connected to receive the reference voltage produced by the reference voltage generator, a second terminal connected to said another terminal of the oscillator and the frequency divider, and a third terminal connectable to the other terminal of the power source.

14. A reference pulse generator according to claim 13; wherein the current limiting element comprises a MOSFET having a gate comprising the first terminal, and a source-drain path connected to said another terminal of the oscillator and the frequency divider and connectable to said other terminal of the power source.

15. A reference pulse generator according to claim 9; wherein the constant current generating means comprises a MOSFET biased by the reference voltage to operate in a saturation mode to produce a constant saturation current.

* * * * *